United States Patent
Gresty et al.

(10) Patent No.: US 10,177,262 B2
(45) Date of Patent: *Jan. 8, 2019

(54) CU2XSNY4 NANOPARTICLES

(71) Applicant: Nanoco Technologies, Ltd., Manchester (GB)

(72) Inventors: Nathalie Gresty, Chester (GB); James Harris, Manchester (GB); Ombretta Masala, Manchester (GB); Nigel Pickett, Manchester (GB); Laura Wylde, Manchester (GB); Christopher Newman, Holmfirth (GB)

(73) Assignee: Nanoco Technologies Ltd., Manchester (GB)

( * ) Notice: Subject to any disclaimer, the term of this patent is extended or adjusted under 35 U.S.C. 154(b) by 110 days.

This patent is subject to a terminal disclaimer.

(21) Appl. No.: 14/210,012

(22) Filed: Mar. 13, 2014

(65) Prior Publication Data
US 2014/0264192 A1 Sep. 18, 2014

Related U.S. Application Data

(60) Provisional application No. 61/799,456, filed on Mar. 15, 2013.

(51) Int. Cl.
| | |
|---|---|
| *H01B 1/06* | (2006.01) |
| *H01L 31/0328* | (2006.01) |
| *H01L 31/18* | (2006.01) |
| *C01G 19/00* | (2006.01) |
| *C01B 19/00* | (2006.01) |
| *B82Y 30/00* | (2011.01) |
| *H01B 1/12* | (2006.01) |
| *H01B 1/10* | (2006.01) |
| *B82Y 40/00* | (2011.01) |

(52) U.S. Cl.
CPC .......... *H01L 31/0328* (2013.01); *B82Y 30/00* (2013.01); *C01B 19/002* (2013.01); *C01G 19/006* (2013.01); *H01B 1/06* (2013.01); *H01L 31/18* (2013.01); *B82Y 40/00* (2013.01); *C01P 2002/30* (2013.01); *C01P 2002/72* (2013.01); *C01P 2002/88* (2013.01); *C01P 2002/89* (2013.01); *C01P 2004/64* (2013.01); *H01B 1/10* (2013.01); *H01B 1/12* (2013.01)

(58) Field of Classification Search
CPC .......... B82Y 30/00; B82Y 40/00; H01B 1/06; H01B 1/10; H01B 1/12
USPC .............. 252/519.3, 519.34, 519.4; 977/813
See application file for complete search history.

(56) References Cited

U.S. PATENT DOCUMENTS

| | | | |
|---|---|---|---|
| 2012/0074361 A1 | 3/2012 | Torimoto et al. | |
| 2012/0138866 A1* | 6/2012 | Agrawal et al. | 252/501.1 |
| 2012/0231276 A1 | 9/2012 | Chane-Ching et al. | |
| 2015/0118144 A1* | 4/2015 | Cao et al. | 423/508 |

FOREIGN PATENT DOCUMENTS

| | | | |
|---|---|---|---|
| CN | 101905901 A | * | 12/2010 |
| CN | 102249344 A | * | 11/2011 |
| JP | 2010-058984 | | 3/2010 |
| WO | 2008132455 A1 | | 11/2008 |
| WO | 20110066205 A1 | | 6/2011 |
| WO | 2012071288 A1 | | 5/2012 |
| WO | 2014136562 A1 | | 9/2014 |

OTHER PUBLICATIONS

The machine translation of CN 101905901A.*
The machine translation of CN 102249344A.*
Therminol® 66 Heat Transfer Fluid MSDS, Version 4.0.*
Synthesis of Pure Metastable Wurtzite CZTS Nanocrystals by Facile One-Pot Method, Li et al., J. Phys. Chem. C 2012, 116, 26507-26516.*
A general strategy for synthesis of quaternary semiconductor Cu2MSnS4 (M = Co2+, Fe2+, Ni2+, Mn2+) nanocrystals, Cui et al., J. Mater. Chem., 2012, 22, 23136-23140.*
Ajay Singh et al., "Colloidal Synthesis of Wurtzite Cu 2 ZnSnS 4 Nanorods and Their Perpendicular Assembly", Journal of the American Chemical Society, vol. 134, No. 6, Feb. 15, 2010, pp. 2910-2913.
Xiaoyan Zhang et al, "Colloidal Synthesis of Wurtzite Cu 2 FeSnS 4 Nanocrystals", Photovoltaic Specialists Conference (PVSC), 2012 38th IEEE, IEEE, Jun. 3, 2012, pp. 1967-1969.
Xiaotang Lu et al., "Wurtzite Cu2ZnSnS4 nanocrystals: a novel quaternary semiconductor", Chemical Communications, vol. 47, No. 11, Jan. 1, 2011, p. 3141.
English translation of Japanese Office Action received in corresponding Japanese patent application No. 2015-562398, dated Oct. 4, 2016.

* cited by examiner

*Primary Examiner* — Haidung D Nguyen
(74) *Attorney, Agent, or Firm* — Blank Rome, LLP

(57) ABSTRACT

Materials and methods for preparing $Cu_2XSnY_4$ nanoparticles, wherein X is Zn, Cd, Hg, Ni, Co, Mn or Fe and Y is S or Se, (CXTY) are disclosed herein. The nanoparticles can be used to make layers for use in thin film photovoltaic (PV) cells. The CXTY materials are prepared by a colloidal synthesis in the presence of labile organo-chalcogens. The organo-chalcogens serves as both a chalcogen source for the nanoparticles and as a capping ligand for the nanoparticles.

20 Claims, 5 Drawing Sheets

CU2XSNY4 NANOPARTICLES

CROSS-REFERENCE TO RELATED APPLICATIONS

This application is a non-provisional of U.S. Provisional Application Ser. No. 61/799,465, filed Mar. 15, 2013, the entire contents of which are incorporated herein by reference.

FIELD OF THE INVENTION

The disclosure relates to materials (and processes for the preparation thereof) useful for the solution-phase fabrication of photovoltaic (PV) devices. More specifically, the disclosure describes a simple, scalable, low temperature colloidal method of synthesising $Cu_2XSnY_4$ nanoparticles, where X is a d-block metal and Y is a chalcogen, for potential application in thin film optoelectronic devices.

BACKGROUND

In recent years, $Cu(In,Ga)Se_2$ (CIGS) materials have been extensively studied for use as an absorber layer in thin film photovoltaic devices, owing to their band gaps that can be tuned by adjusting the elemental ratios and are well matched with the solar spectrum (1.1 eV for $CuInSe_2$ to 1.7 eV for $CuGaSe_2$), offering potentially high conversion efficiencies; 20.3% conversion efficiency was achieved using $Cu(In_xGa_{1-x})Se_2$ material by researchers at ZSW and the Centre for Solar Energy and Hydrogen Research in Germany (August 2010). One drawback of CIGS materials is the high manufacturing cost, due to the high cost of the constituent elements. $Cu_2ZnSnS_4$ (CZTS) materials can be used as a low-cost alternative to traditional $Cu(In,Ga)Se_2$, due to the abundance and low toxicity of Zn and Sn, which are much cheaper than Ga and the rarer In.

Recently there have been efforts to investigate the direct band gap of this material. CZTS is reported to have a band gap between 1.45 and 1.6 eV [H. Katagiri et al., *Appl. Phys. Express*, 2008, 1, 041201; K. Ito et al., *Jpn. J. Appl. Phys.*, 1988, 27 (Part 1), 2094; T. M. Friedlmeier et al., *Proc. 14th European PVSEC*, Barcelona, Spain, 30 Jun. 1997, p. 1242] and a high optical absorption coefficient (up to $10^5$ cm$^{-1}$) [G. S. Babu et al., *J. Phys. D: Appl. Phys.*, 2008, 41, 205305], which are similar to those of $CuInGaSe_2$. The current record conversion efficiency for pure $Cu_2ZnSnS_4$ of 8.4% [B. Shin et al., *Prog. Photovolt.: Res. Appl.*, 2013, 21, 72] shows great potential for this material.

Related compounds, where Zn is partially or completely substituted with another d-block element, Sn is substituted with a group 14 element and/or S is partially or entirely replaced with another chalcogen are also of interest. Examples include $Cu_2ZnSnSe_4$, $Cu_2ZnSnTe_4$, $Cu_2CdSnSe_4$, $Cu_2CdSnTe_4$, [H. Matsushita et al., *J. Mater. Sci.*, 2005, 40, 2003] $Cu_2FeSnS_4$, [X. Zhang et al., *Chem. Commun.*, 2012, 48, 4656], and $Cu_{2+x}Zn_{1-x}GeSe_4$. [W. G. Zeier et al., *J. Am. Chem. Soc.*, 2012, 134, 7147] With the exception of $Cu_2CoSiSe_4$, and $Cu_2NiSiSe_4$, all compounds in the series $Cu_2$-II-IV(S,Se)$_4$ (II=Mn, Fe, Co, Ni, Zn, Cd, Hg; IV=Si, Ge, Sn) have been synthesised and structurally characterised in the bulk form, as described by Schäfer and Nitsche. [W. Schäfer and R. Nitsche, *Mat. Res. Bull.*, 1974, 9, 645] Though the substitution of Zn, Sn and/or S may not necessarily offer financial advantages, these compounds are nevertheless attractive for optoelectronic applications as they offer a range of thermodynamic, optical and electrical properties that can be exploited. For example, $Cu_2Zn_{1-x}Cd_xSn(Se_{1-y}S_y)_4$ is a semiconductor with a band gap that can be tuned from 0.77 eV (x=0.5, y=0) to 1.45 eV (x=0, y=1) and displays p-type conductivity. [M. Altosaar et al., *Phys. Stat. Sol. (a)*, 2008, 205, 167] Ab initio studies on $Cu_2ZnSnSe_4$, $Cu_2CdSnSe_4$ and $Cu_2ZnSnS_4$ suggest that their thermoelectric performance can be enhanced by Cu doping at the Zn/Cd site. [C. Sevik and T. Çağin, *Phys. Rev. B*, 2010, 82, 045202] Other studies have focussed on manipulation of the crystallographic phase of these materials [X. Zhang et al., *Chem. Commun.*, 2012, 48, 4656] and the resultant changes in their electronic properties. [W. Zalewski et al., *J. Alloys Compd.*, 2010, 492, 35]

Methods to produce CIGS- and CZTS-type solar cells with high power conversion efficiency (PCE) often employ vacuum-based deposition of the absorber layer. Vacuum-based approaches typically offer high uniformity, which translates to a high quality film. However, the techniques are also generally costly, with material consumption and energy usage being high. Non-vacuum-based approaches are attractive in that they are typically higher throughput processes, with a lower deposition cost. One such method is a nanoparticle-based deposition approach. Nanoparticles offer several advantages over bulk materials for thin film optoelectronic applications. Firstly, a small amount of nanoparticle material can be dissolved or dispersed in a solvent, then printed on a substrate, e.g. by spin coating, slit coating or doctor blading; vapour phase or evaporation techniques are far more expensive, requiring high temperatures and/or pressures. Secondly, nanoparticles are able to pack closely, facilitating their coalescence upon melting. Upon coalescence the particles can form large grains. Additionally, the melting point of nanoparticles is lower than that of the bulk material, allowing lower processing temperatures for device fabrication. Finally, nanoparticles can be synthesised in colloidal solutions. Colloidal nanoparticles may be capped with an organic ligand (capping agent); this assists in solubilising the particles, thus facilitating the processability of the material.

Nanoparticles can be synthesised from a top-down or a bottom-up approach. In a top-down approach, macroparticles are processed, e.g. using milling techniques, to form nanoparticles; the particles are typically insoluble, therefore difficult to process, and in the case of milling the size distribution may be large. Using a bottom-up approach, whereby nanoparticles are grown atom-by-atom, smaller particles with a homogeneous size distribution may be produced. Colloidal syntheses can be employed to grow nanoparticles in solution, which can be passivated with organic ligands to provide solubility, and thus solution processability.

The colloidal synthesis of CZTS nanoparticles has been described in the prior art. The colloidal synthesis of $Cu_2XSnY_4$ nanoparticles, where X is a d-block element and Y is a chalcogen, herein referred to as "CXTY", is less well documented, however a number of examples exist.

Ou et al. described the synthesis of $Cu_2ZnSn(S_xSe_{1-x})_4$ nanoparticles via the hot-injection of a solution of Cu, Sn and Zn stearate salts, dissolved in oleylamine, into a mixture of thiourea, oleylamine and octadecene, at 270° C. [K.-L. Ou et al., *J. Mater. Chem.*, 2012, 22, 14667]

The hot-injection synthesis of $Cu_2Zn_xSn_ySe_{4x+2y}$ nanoparticles has been described by Shavel and co-workers. [A. Shavel et al., *J. Am. Chem. Soc.*, 2010, 132, 4514] Trioctylphosphine selenide was injected into a solution of Cu, Zn and Sn salts dissolved in a mixture of hexadecylamine and octadecene, at 295° C.

The preparation of $Cu_2FeSnS_4$ nanoparticles has been described by Zhang et al. [X. Zhang et al., *Chem. Commun.*, 2012, 48, 4656] A mixture of 1-dodecanethiol and t-dodecanethiol was injected into a solution of Cu, Fe and Sn salts in oleylamine at moderate temperature (150° C.). The solution was subsequently heated 210° C. to prepare wurtzite nanocrystals. To synthesise zinc blende nanocrystals, the solution was heated to 310° C., replacing oleylamine with oleic acid and octadecene.

The colloidal methods of making CXTY nanoparticle materials described in the prior art have one or more disadvantages including the use of hot-injection and/or high boiling capping agents (ligands).

Hot-injection techniques can be used to synthesis small nanoparticles with a uniform size distribution. The technique relies on the injection of small volumes of precursors into a large volume of solvent at elevated temperature. The high temperature causes breakdown of the precursors, initiating nucleation of the nanoparticles. However, the technique results in low reaction yields per volume of solvent, thus making the reactions difficult to scale to commercial volumes.

Other prior art techniques utilise high boiling ligands, such as oleylamine, hexadecylamine or oleic acid. Organic ligands assist in solubilising the nanoparticles to facilitate solution processability, yet they must be removed, e.g. by evaporation, prior to sintering, since residual carbon can be detrimental to the optoelectronic performance of the absorber layer. Thus it is favourable that the boiling temperature of any capping ligand(s) should be substantially lower than the sintering temperature of the CXTY film.

Thus, there is a need for a commercially scalable method to synthesise CXTY nanoparticle capped with a relatively low-boiling ligand that is suitable for low temperature optoelectronic device processing.

BRIEF SUMMARY

Materials and methods for preparing $Cu_2XSnY_4$ (CXTY) nanoparticles, wherein X is Zn, Cd, Hg, Ni, Co, Mn or Fe and Y is S or Se, are disclosed herein. The nanoparticles can be used to make layers for use in thin film PV cells. The CXTY nanoparticles are prepared by a colloidal synthesis. The disclosed methods are advantageous over the prior art because they are scalable for mass manufacture (kg scale) of PV materials. The scalability is due to a high yield per volume of reaction solution.

For thin film photovoltaic applications, the organic ligand-capped nanoparticles are dissolved or dispersed in solution, then deposited on a substrate using a printing or coating technique. Prior to sintering, the ligand must be removed by annealing within the device processing conditions to remove carbon from the film. As such, the ligand is preferably labile. The processes described herein provide labile ligand-capped nanoparticles, i.e., nanoparticles for which the ligand is easily removed at moderate temperatures. The process involves reacting copper precursors, X (as defined above) precursors, and Sn precursors in the presence of labile organo-chalcogens. The organo-chalcogens serve both as a source of chalcogen (i.e., S or Se) for the nanoparticle material and as the labile surface-capping ligands.

DESCRIPTION

Figure 2:
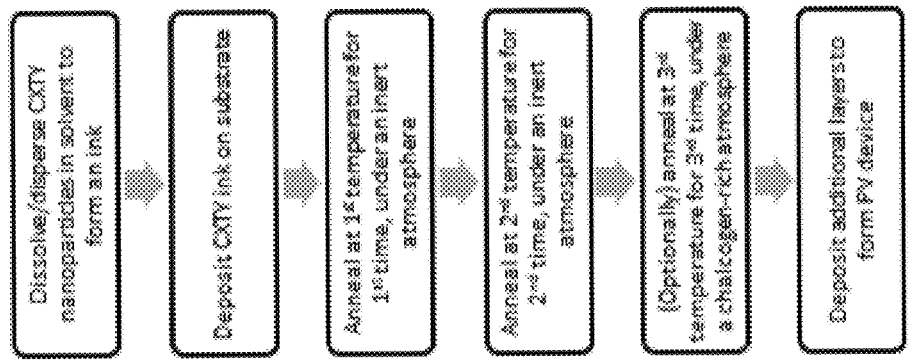
FIG. 2 is a flow chart summarising the process for preparing a PV device from CXTY nanoparticles according to the method described herein.

Applicant's U.S. patent application Ser. No. 61/798,084 (filed 15 Mar. 2013) describes the synthesis of CZTS nanoparticles capped with an organo-thiol ligand, and is hereby incorporated by reference in its entirety. As used herein, the term "CXTY" refers to compounds of the form $Cu_2XSnY_4$, where X is a d-block metal and Y is a chalcogen. It will be understood that the formula is not meant to imply a stoichiometry where the ratio of Cu:X:Sn:Y is exactly 2:1:1:4; one of skill in the art will appreciate that those ratios are estimates only. As used herein, "low temperature synthesis" refers to a heating-up method of synthesis wherein the reaction solution is heated at temperatures of 300° C. or below, more particularly 250° C. or below, or 240° C. or below, to effect the conversion of the precursors to nanoparticles. In a heating-up method, the nanoparticles are combined at modest temperatures, for example, between room temperature and 200° C., and the reaction solution is subsequently heated to induce nanoparticle formation. Thus, a low temperature synthesis is different than a hot-injection synthesis because the precursors are combined at significantly lower temperatures and the concentration of the precursors in the reaction solution is significantly higher than for a hot-injection reaction.

As explained above, the surfaces of nanoparticles are generally capped with organic ligands that prevent the nanoparticles from agglomerating and that aid in the solution and deposition of the nanoparticles to make films. Generally, prior art techniques utilise high boiling ligands, such as oleylamine. The organic ligands must be removed, e.g. by evaporation, prior to sintering, since residual carbon can be detrimental to the performance of the absorber layer. Aspects of the processes described herein provide CXTY nanoparticles that having surface coatings consisting essentially of labile organo-chalcogen ligands. As used herein, the term "labile organo-chalcogen" refers to an organo-chalcogen with a boiling point less than 300° C. According to some embodiments, nanoparticles having surface coatings consisting essentially of labile organo-chalcogens readily lose those capping ligands when the nanoparticles are heated to moderate temperatures. According to some embodiments, greater than 50% of the surface coating consisting essentially of labile organo-chalcogen is removed from the nanoparticle surface when the nanoparticle is heated to 350° C. Since the surface coatings provided by the methods described herein are removable at lower temperatures than those described in the prior art, the resulting nanoparticles are more easily processed and yield higher performing films. The nanoparticles described herein, having surface coatings consisting essentially of labile organo-chalcogens provide an advantage over the CXTY nanoparticles described in the art, which have high-boiling capping ligands, such as oleylamine or oleic acid.

The process disclosed herein comprises a relatively low-temperature, high yield synthesis of nanoparticles of the form CXTY, where X is a d-block metal (e.g., Zn, Cd, Hg, Ni, Co, Mn or Fe) and Y is a chalcogen (e.g., S or Se). The CXTY material can be used as an alternative to CIGS materials as an absorber layer in thin film photovoltaic devices.

Figure 1:
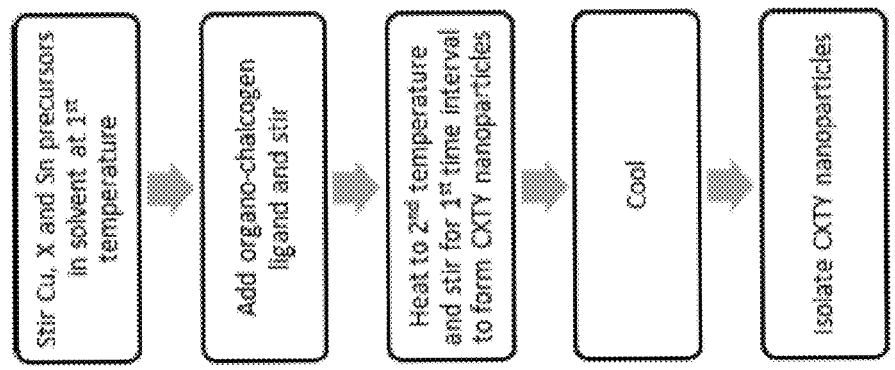
FIG. 1 is a flow chart summarising the process for preparing CXTY nanoparticles according to the method described herein.

An embodiment of a process for forming CXTY nanoparticles is summarised in FIG. 1. The process comprises: (a) combining Cu, X and Sn precursors in a solvent at a first temperature; (b) adding an organo-chalcogen ligand; (c) heating to a second temperature for a first time interval to form the CXTY nanoparticles; (d) cooling the reaction mixture; and (e) isolating the CXTY nanoparticles. Using the illustrated method, it is possible to produce a wide range of CXTY nanoparticle material.

Suitable Cu precursors include, but are not restricted to: acetates, e.g. Cu(ac), Cu(ac)$_2$; acetylacetonates, e.g. Cu(acac)$_2$; and chlorides, e.g. CuCl, CuCl$_2$. X can be one or more d-block elements, including, but not restricted to: Zn, Cd, Hg, Ni, Co, Mn, Fe. Suitable precursors may include, but are not restricted to: acetates, e.g. Zn(ac)$_2$, Cd(ac)$_2$, Cd(ac)$_2$.2H$_2$O, Hg(ac)$_2$, Ni(ac)$_2$.4H$_2$O, Co(ac)$_2$.4H$_2$O, Mn(ac)$_2$.2H$_2$O, Fe(ac)$_2$; acetylacetonates, e.g. Cd(acac)$_2$, Ni(acac)$_2$, Ni(acac)$_3$, Co(acac)$_2$, Co(acac)$_3$, Mn(acac)$_2$, Mn(acac)$_3$, Fe(acac)$_2$, Fe(acac)$_3$; chlorides, e.g. ZnCl$_2$, CdCl$_2$, HgCl$_2$, NiCl$_2$, CoCl$_2$, MnCl$_2$, FeCl$_2$, FeCl$_2$.4H$_2$O, FeCl$_3$, FeCl$_3$.6H$_2$O; and stearates, e.g. Zn(st)$_2$, Ni(st)$_2$, Co(st)$_2$.

Suitable Sn precursors include, but are not restricted to, chlorides, e.g. SnCl$_4$, SnCl$_4$.5H$_2$O, tin(IV)acetate, tin(IV) bis(acetylacetonate) dichloride and triphenyl(trimethyl) tin. A particularly suitable Sn precursor is SnCl$_4$ as a solution in dichloromethane, due to its relative ease and safety in handling. The dichloromethane solvent can be removed by distillation during the nanoparticle synthesis.

The solvent is used to dissolve or suspend the Cu, X and Sn precursors. In some embodiments, the solvent is dichloromethane. Other suitable examples include, but are not restricted to, non-coordinating solvents such as 1-octadecene and ®66 [Eastman Chemical Company]. Therminol® 66 is a known heat transfer fluid. One skilled in the art will realize that, where the boiling point of the solvent is lower than the reaction temperature required to effect the conversion of the precursors to CXTY nanoparticles, it may be necessary to distil the solvent during the course of heating the reaction mixture to the second (reaction) temperature.

The first temperature, at which the Cu, X and Sn precursors are combined with the solvent, is substantially below the boiling point of the solvent. In some embodiments, the first temperature is room temperature.

The organo-chalcogen ligand is of the form R—Y—H, where R is an alkyl or aryl group and Y is sulphur or selenium. In some embodiments, the organo-chalcogen ligand functions as both the reaction solvent and the nanoparticle capping agent. In some embodiments, the organo-chalcogen ligand comprises two or more organo-chalcogen compounds. In particular embodiments, it may be desirable for the boiling point(s) of the organo-chalcogen ligand(s) to fall within the range 180-300° C., to allow both synthesis of phase-pure CXTY nanoparticles and to effect the removal of the ligand(s) during subsequent device processing. Examples of suitable organo-chalcogen ligands include, but are not restricted to: 1-octanethiol, 1-dodecanethiol, t-dodecanethiol, 2-naphthalenethiol, 1-octane selenol, and 1-dodecane selenol.

According to some embodiments, the organo-chalcogen ligand is combined with the Cu, X and Sn precursors and the first solvent at a temperature not greater than 50° C., for example, room temperature.

In some embodiments, two or more d-block metals (X) and/or two or more chalcogens (Y) are combined to form an alloyed material.

The reaction mixture is heated to a second temperature for a first time interval to effect the conversion of the precursors to CXTY nanoparticles. In some embodiments, the second temperature lies in the range 180-300° C., for example around 220-240° C. The first time interval lies in the range of 30 minutes-5 hours, for example around 1 hour.

Optionally, a secondary chalcogen precursor can be added to the reaction solution during synthesis to maintain particle growth. Suitable precursors include, but are not restricted to, trioctylphosphine sulphide, and trioctylphosphine selenide.

Following nanoparticle formation, the reaction mixture is cooled and the CXTY nanoparticles are isolated. The nanoparticles may be isolated via any method known in the prior art, for example, by precipitating the nanoparticles using a combination of solvents and non-solvents, then collecting the nanoparticles via centrifugation. Examples of suitable solvent/non-solvent combinations include chloroform and acetone, and dichloromethane and methanol.

The CXTY nanoparticles can be processed and incorporated into a photovoltaic device. A process preparing a thin film using CXTY nanoparticles is shown in FIG. 2. The method comprises: (a) dissolving or dispersing the CXTY nanoparticles in one or more solvents to form an ink; (b) depositing the ink on a substrate; (c) annealing at a first temperature, for a first time interval, under an inert atmosphere to remove the ligand; (d) annealing at a second temperature, for a second time interval, under an inert atmosphere to induce crystallisation of the film; and (e) optionally annealing at a third temperature, for a third time interval, under a chalcogen-rich atmosphere. Subsequent layers can then be deposited to form a photovoltaic device.

The CXTY nanoparticles can be dissolved or dispersed in one or more solvents by any method known to one skilled in the art, including shaking, stirring or ultrasonication. In some embodiments, the solvent(s) is/are non-polar.

Examples include, but are not restricted to, toluene, alkanes (e.g. hexane), chlorinated solvents e.g. (dichloromethane, chloroform, etc.), ketones (e.g. isophorone), ethers (e.g. anisole), and terpenes (e.g. α-terpinene, limonene, etc.). Optionally, other additives, such as binders, rheology modifiers, and the like, may be incorporated into the ink formulation to modify its coating properties.

The ink can be deposited on a substrate using any method known to one skilled in the art. Examples include, but are not restricted to, spin-coating, slit-coating, drop-casting, doctor blading, and inkjet printing.

Once deposited, the ink is annealed at a first temperature to remove the solvent, ligand, and other organic components of the ink formulation. This eliminates carbon residues, which can be detrimental to device performance, from the film. It will be apparent to one skilled in the art that the first annealing temperature depends on the boiling points of the organic components of the nanoparticle ink. In particular embodiments, the first annealing temperature lies in the range 260-350° C., for example around 300° C. In some embodiments, the first time interval preferably lies in the range 3-10 minutes, for example around 5 minutes. In some embodiments, the first annealing step is conducted under an inert atmosphere.

The films are annealed at a second temperature to induce crystallisation of the CXTY layer (sintering). In some embodiments, the second annealing temperature is higher than the first annealing temperature. For example, the second annealing temperature may lie in the range 350-440° C., for example around 400° C. In particular embodiments, the second time interval lies in the range 3-10 minutes, for example around 5 minutes. In some embodiments, the sintering step is conducted under an inert atmosphere.

The ink deposition, first and second annealing steps may be repeated until a desired film thickness is achieved. Optionally, the films may be annealed under a chalcogen-rich atmosphere. Examples of sulphurisation sources include, but are not restricted to, $H_2S$ and elemental sulphur. Examples of selenisation sources include, but are not restricted to, $H_2Se$ and elemental selenium. In some embodiments, the third annealing temperature lies in the range 500-600° C., for example around 550° C. The third time interval may, for example, lie in the range 30 minutes-3 hours, more particularly around 1-2 hours.

Additional layers can be deposited on top of the CXTY layer to form a PV device. The method of forming CXTY nanoparticles is illustrated in the following examples.

EXAMPLES

Example 1: Synthesis of CZTSe Nanoparticles

Example 1.1

Synthesis of CZTSe nanoparticles using 1-octane selenol as the selenium precursor. 1.0 g of Cu(ac) (8.2 mmol; ac=acetate), 0.74 g of Zn(ac)$_2$ (4.0 mmol), and 4.1 mL of a 1 M solution of SnCl$_4$ in dichloromethane (4.1 mmol) were stirred at room temperature in a 50 mL three-necked round-bottomed flask fitted with a magnetic stirrer and a condenser with a side-arm. 5 mL of dichloromethane were added to dissolve/suspend the salts, forming a grey solution. The mixture was degassed by bubbling through nitrogen at room temperature. After stirring under nitrogen for 1½ hours the solution had turned a beige/cream colour. 11.6 mL of 1-octane selenol (65.0 mmol) were injected quickly into the flask; the mixture turned instantly dark red. The temperature was raised to 50-55° C. and held for 5 minutes to allow the dichloromethane, which collected in the side-arm of the condenser, to distil off. The mixture turned a bright golden orange colour. The temperature was raised to 140° C., whereupon a brown/black slurry formed. The temperature was held at 140° C. for 1 hour, before cooling to room temperature. The product, a black solid (1.63 g), was isolated with chloroform and acetone. The solid was collected by centrifugation. The particles were dispersible in non-polar solvents.

Figure 3:
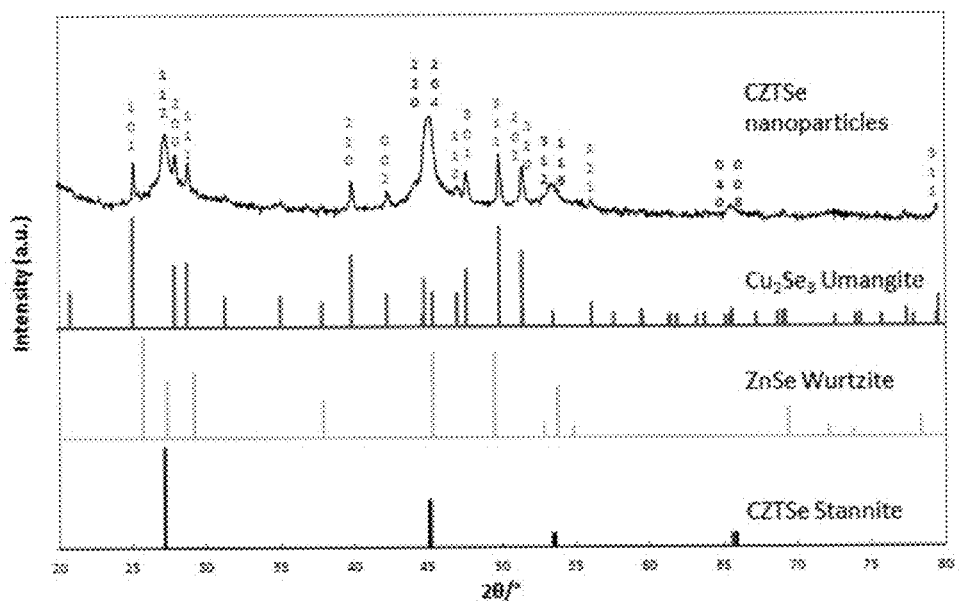
FIG. 3 shows the X-ray diffraction (XRD) pattern for CZTSe nanoparticles prepared according to Example 1.1, which matches well with the CZTSe stannite and $Cu_2Se_3$ umangite phases. Wurtzite ZnSe [K. Yvon et al., *J. Appl. Cryst.*, 1977, 10, 73], a common impurity in CZTSe materials is included for reference, but does not appear to exist in this material.

Elemental analysis by inductively coupled plasma optical emission spectrometry (ICP-OES) gave the following elemental ratios: C 21.44%; H 3.78%; Cu 22.63%; Zn 4.50%; Sn 8.82%; Se 37.24%. Normalising to Sn, this gives a stoichiometry of $Cu_{4.79}Zn_{0.92}Sn_{1.00}Se_{6.35}$, suggesting that the material is Cu- and Se-rich. The selenol ligand contributes to the total Se content. X-ray diffraction (XRD) analysis (FIG. 3) suggests the presence of both the stannite phase of CZTSe and an umangite $Cu_2Se_3$ impurity phase. For thin film PV applications, copper selenide impurity phases can act as a sintering flux. Afterwards, they can be selectively removed from the absorber layer via KCN etching, [Q. Guo et al., *Nano Lett.*, 2009, 9, 3060] leaving behind a stoichiometric, phase pure CZTSe film.

The stoichiometry can be tuned by altering the ratios of the metal precursors. Phase purity may be achieved by controlling the reaction conditions. For example, in the colloidal synthesis of CZTS nanoparticles using metal acetate precursors, Kameyama et al. reported the presence of copper selenide impurity phases at low temperatures, which could be eliminated by increasing the reaction temperature above 180° C. [T. Kameyama et al., *J. Mater. Chem.*, 2010, 20, 5319] Similarly, to synthesise phase-pure CZTSe nanoparticles using the current method, 1-octane selenol may be substituted for a higher boiling selenol precursor, acting as both the reaction solvent and ligand, to facilitate a higher reaction temperature and thus preferential formation of the CZTSe phase. Suitable higher boiling selenol compounds include, but are not restricted to, 1-dodecane selenol, as in Example 1.2, where CZTSe nanoparticles with a pure wurtzite crystal structure were synthesised at 240° C.

Figure 4:
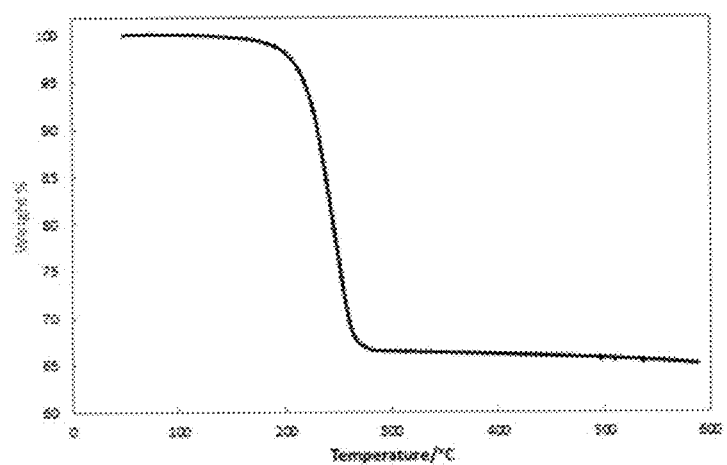
FIG. 4 shows thermogravimetric analysis (TGA) of CZTSe nanoparticles capped with 1-octane selenol, prepared according to Example 1.1, showing an inorganic content of 65%.

Thermogravimetric analysis (TGA, FIG. 4) shows that the material has an inorganic content of approximately 65%. The ligand is completely removed below 300° C., which would enable relatively low temperature optoelectronic device processing.

Example 1.2

Synthesis of CZTSe nanoparticles using 1-dodecane selenol as the selenium precursor. 1.00 g of Cu(ac) (8.2 mmol) and 74 g of Zn(ac)$_2$ (4.0 mmol) were purged with nitrogen in a 50 mL three-necked round-bottomed flask fitted with a magnetic stirrer and a condenser with a side-arm. 5 mL of dichloromethane and 4.1 mL of a 1 M solution of SnCl$_4$ in dichloromethane (4.1 mmol) were stirred at room temperature, under nitrogen, for 90 minutes to form a beige suspension. 15 mL of 1-dodecane selenol were injected quickly into the flask. The temperature was raised to 50-60° C. to allow the dichloromethane, which collected in the side-arm of the condenser, to distil off. The temperature was raised to 240° C. and held for 1 hour, before cooling to room temperature. The product, a black powder (2.49 g), was isolated with chloroform/acetone and dichloromethane/methanol, and collected by centrifugation. The particles were dispersible in non-polar solvents.

Figure 5:
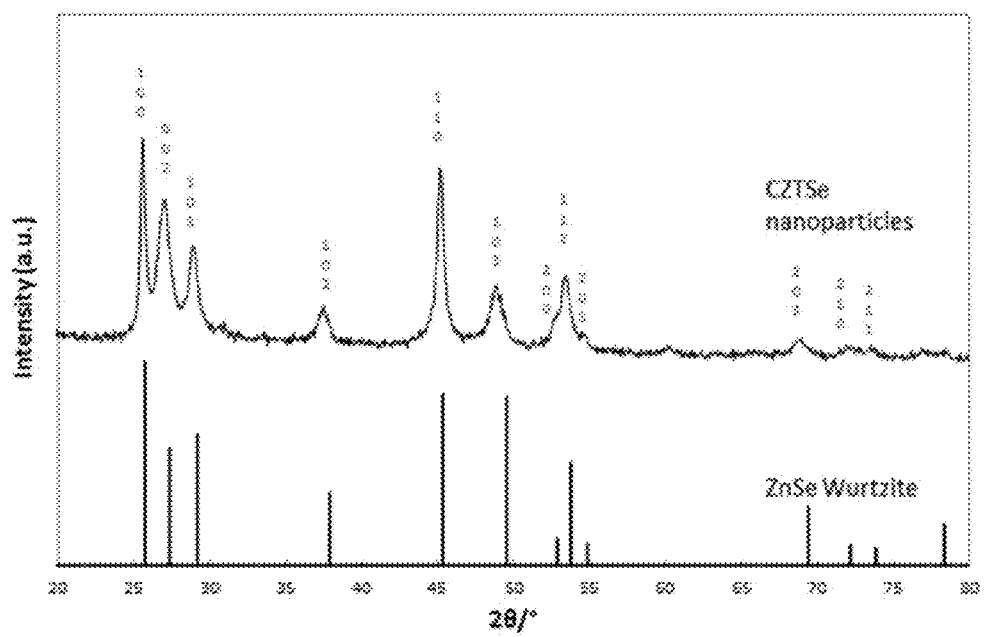
FIG. 5 shows the XRD pattern of CZTSe nanoparticles synthesised with 1-dodecane selenol, as described in Example 1.2. The peak positions match well with the wurtzite crystal structure of ZnSe. [K. Yvon et al., *J. Appl. Cryst.*, 1977, 10, 73] Differences in the relative peak intensities and slight shifting of the peak positions may be attributable to the partial substitution of Zn with Cu and Sn.
Figure 6:
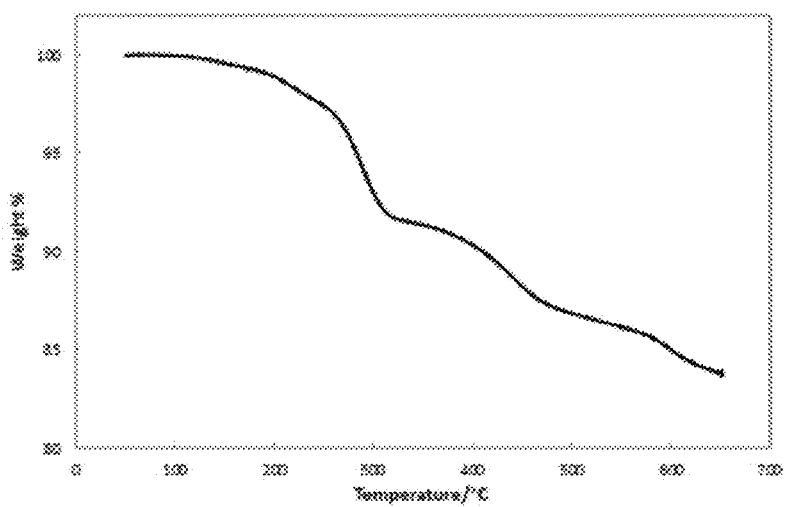
FIG. 6 is a TGA plot of CZTSe nanoparticles capped with 1-dodecane selenol, as prepared in Example 1.2, showing removal of the ligand between approximately 200-320° C.

Elemental analysis of the inorganic content by ICP-OES gave the following elemental ratios: Cu 15.76%; Zn 7.53%; Sn 20.13%; Se 53.62%. Normalising to Sn, this gives a stoichiometry of $Cu_{1.46}Zn_{0.67}Sn_{1.00}Se_{4.00}$, where the selenol ligand contributes to the total Se content, therefore it is reasonable to assume that the material is Sn-rich. The stoichiometry can be tuned by altering the ratios of the metal precursors. XRD analysis (FIG. 5) suggests a wurtzite crystal structure; the peak positions match well with those of wurtzite ZnSe. [K. Yvon et al., *J. Appl. Cryst.*, 1977, 10, 73] Slight shifting of the peak positions may be attributable to the partial substitution of Zn with Cu and Sn. Four-coordinate $Zn^{2+}$ has an ionic radius of 60 pm, while those of $Cu^+$ and $Sn^{4+}$ are 46 pm and 74 pm, respectively; [C. E. Housecroft and E. C. Constable, *Chemistry* ($3^{rd}$ Edition); Pearson Education Limited: Harlow, 2006; pp. 1195-1197] the slight shift of the XRD pattern of CZTSe to lower angles compared to those of ZnSe suggests an overall expansion of the wurtzite unit cell upon the incorporation of Cu and Sn. Differences in the relative peak intensities of the CZTSe nanoparticles compared to wurtzite ZnSe may suggest preferential crystal growth in one or more directions.

TGA indicates that the 1-dodecane selenol ligand begins to evaporate at around 200° C. and is totally removed by around 320° C., as shown in Error! Reference source not found. Further mass loss above 350° C. may be due to loss of inorganic material, suggesting the dodecane selenol-capped CZTSe nanoparticles are particularly suited to relatively low temperature thermal processing (<350° C.).

Example 2: Synthesis of CFTS Nanoparticles

Example 2.1

Synthesis of CFTS nanoparticles using $Fe(acac)_3$ (acac=acetylacetonate) as the iron precursor. 1.0 g of Cu(ac) (8.2 mmol), 1.48 g of $Fe(acac)_3$ (4.2 mmol), and 4.1 mL of a 1 M solution of $SnCl_4$ in dichloromethane (4.1 mmol) were stirred at room temperature in a 50 mL three-necked round-bottomed flask fitted with a magnetic stirrer and a condenser with a side-arm. 5 mL of dichloromethane were added to dissolve/suspend the salts, forming a dark red mixture. The mixture was degassed by bubbling through nitrogen at room temperature for 1½ hours. 15.5 mL of 1-dodecanethiol (64.7 mmol) were injected quickly into the flask; the mixture turned instantly brown. The temperature was raised to 60° C. and the dichloromethane, which collected in the side-arm of the condenser, was distilled off. The temperature was raised to 220-240° C., then held and stirred for 1 hour, before cooling to room temperature. The product, a black powder (1.57 g), was isolated with chloroform and acetone. The solid was collected by centrifugation and dried under vacuum. The particles were dispersible in non-polar solvents.

Figure 7:
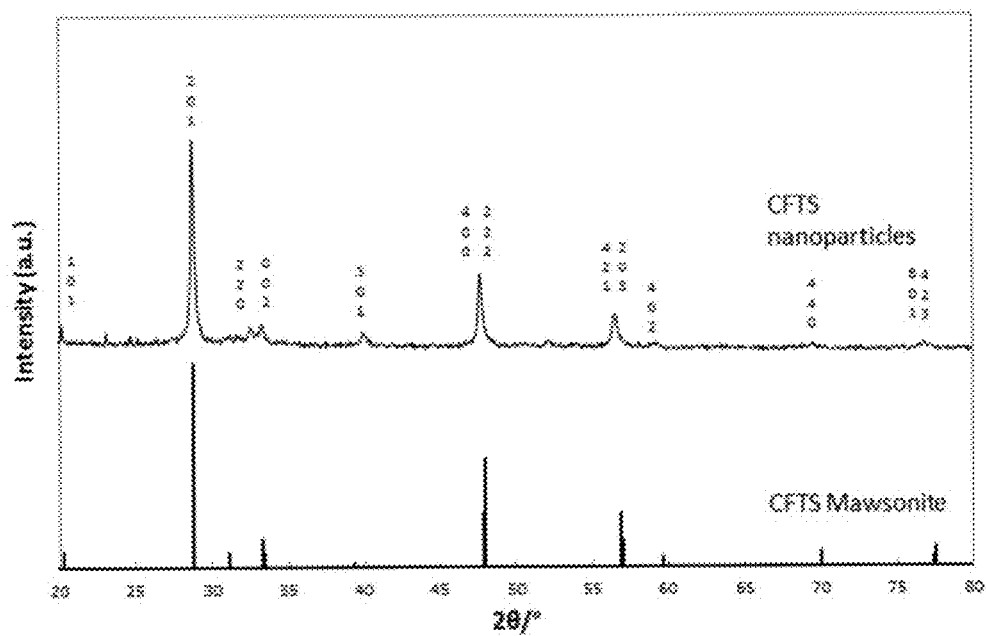
FIG. 7 is an XRD pattern of CFTS nanoparticles as prepared in Example 2.1. The peak positions are well matched to those of mawsonite CFTS. [J. T. Szymanski, *Canad. Mineral.*, 1976, 14, 529]

Elemental analysis by ICP-OES gave the following elemental ratios: C 15.12%; H 2.98%; Cu 35.31%; Fe 2.53%; Sn 16.15%; S 19.69%. Normalising to Sn, this gives a stoichiometry of $Cu_{4.08}Fe_{0.33}Sn_{1.00}S_{4.51}$, suggesting that the material is Cu-rich, and that Cu may be doping Fe vacancies and interstitial positions. The thiol ligand contributes to the total S content. XRD analysis (FIG. 7) shows that the material closely matches the mawsonite crystal structure of CFTS, [J. T. Szymanski, *Canad. Mineral.*, 1976, 14, 529] without any obvious impurity phases. The stoichiometry can be tuned by altering the ratios of the precursors.

Figure 8:
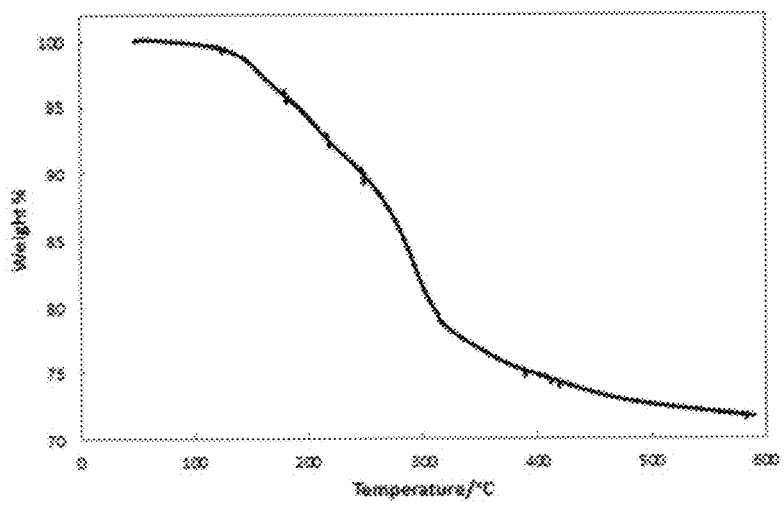
FIG. 8 is a TGA plot of CFTS nanoparticles capped with 1-dodecanethiol, as prepared in Example 2.1.

TGA (FIG. 8) indicates that the material has an inorganic content of approximately 72% at 600° C. Loss of the 1-dodecanethiol ligand is accounted for by the high negative gradient of the curve between 250-350° C. Further mass loss beyond 350° C. is likely to be that of elemental sulphur from the nanoparticles (boiling point: 444.7° C.). The TGA thus highlights that a low boiling ligand is advantageous for thin film optoelectronic applications, since the ligand can be removed at lower boiling temperatures without concomitant loss of inorganic sulphur from the nanoparticles.

Example 2.2

Synthesis of CFTS nanoparticles using $Fe(acac)_2$ as the iron precursor. 1.0 g of Cu(ac) (8.2 mmol), 1.06 g of $Fe(acac)_2$ (4.2 ml), and 4.1 mL of a 1 M solution of $SnCl_4$ in dichloromethane (4.1 mmol) were stirred at room temperature in a 50 mL three-necked round-bottomed flask fitted with a magnetic stirrer and a condenser with a side-arm. 5 mL of dichloromethane were added to dissolve/suspend the salts, forming a dark brown mixture. The mixture was degassed by bubbling through nitrogen at room temperature for 1½ hours. 15.5 mL of 1-dodecanethiol (64.7 mmol) were injected quickly into the flask; the mixture remained brown. The temperature was raised to 60° C. and the dichloromethane, which collected in the side-arm of the condenser, was distilled off. The mixture was heated to 240° C. At 170° C. the mixture became orange/brown, darkening with further increases in temperature. The solution was then held and stirred at 230-240° C. for 1 hour, before cooling to room temperature. The product, a black solid (1.2 g), was isolated with chloroform and acetone. The solid was collected by centrifugation and dried under vacuum. The particles were dispersible in non-polar solvents, including toluene, cyclohexane, and hexanethiol.

Elemental analysis by ICP-OES gave the following elemental ratios: C 18.68%; H 3.41%; Cu 38.25%; Fe 4.20%; Sn 12.49%; S 18.57%. Normalising to Sn, this gives a stoichiometry of $Cu_{5.72}Fe_{0.71}Sn_{1.00}S_{5.50}$, suggesting that the material is Cu-rich, and that Cu may be doping Fe vacancies and interstitial positions. The thiol ligand contributes to the total S content. The stoichiometry can be tuned by altering the ratios of the precursors.

Example 3: Synthesis of CZTSSe Nanoparticles

As the current method can be used to synthesise CZTSe nanoparticles and the applicant's U.S. patent application Ser. No. 61/798,084 (filed 15 Mar. 2013) describes the synthesis of CZTS nanoparticles, it will be obvious to one skilled in the art that by using a combination of one or more alkyl and/or aryl thiol and one or more alkyl and/or aryl selenol compounds, nanoparticle material of the form $Cu_2ZnSn(S, Se)_4$ can be produced, as shown in Example 3.1. The stoichiometry of the material, and thus the band gap, can be tuned by controlling the thiol:selenol ratio. The upper limit to the reaction temperature will be restricted by the lowest boiling point of the organo-chalcogen compounds. The organo-chalcogen compounds can be mixed prior to their addition to the reaction solution, or alternatively they can be injected concurrently or sequentially.

In some embodiments, the organo-thiol compound(s) have a boiling temperature greater than 180° C. but substantially below the boiling points of elemental sulphur and selenium, for example below 300° C. Suitable examples include, but are not restricted to: 1-octanethiol, 1-dodecanethiol, t-dodecanethiol, 2-naphthalenethiol.

In some embodiments, the organo-selenol compound(s) have a boiling temperature greater than 180° C. but substantially below the boiling points of elemental sulphur and selenium, for example below 300° C. Suitable examples include, but are not restricted to: 1-octane selenol, 1-dodecane selenol.

Example 3.1

Synthesis of CZTSSe nanoparticles using 1-octane thiol and 1-octane selenol as the chalcogen precursors. 1.00 g of Cu(ac) (8.2 mmol) and 0.74 g of Zn(ac)$_2$ (4.0 mmol) were purged with nitrogen in a 100 mL three-necked round-bottomed flask fitted with a magnetic stirrer and a condenser with a side-arm. 480 μL of SnCl$_4$ in 4 mL of dichloromethane (4.1 mmol) were added, followed by a further 5 mL of dichloromethane, then the mixture was stirred at room temperature, under nitrogen, for 1 hour. 6.0 mL of 1-octanethiol (35 mmol) and 6.0 mL of 1-octane selenol (34 mmol), both pre-degassed, were injected quickly into the flask. The temperature was raised to 55° C. and held to allow the dichloromethane, which collected in the side-arm of the condenser, to distil off. The temperature was raised to 220° C. and held for 1 hour, before cooling to room temperature. The product (2.58 g), a black powder, was isolated with chloroform/acetone and dichloromethane/methanol. The solid was collected by centrifugation. The particles were dispersible in non-polar solvents.

Figure 9:
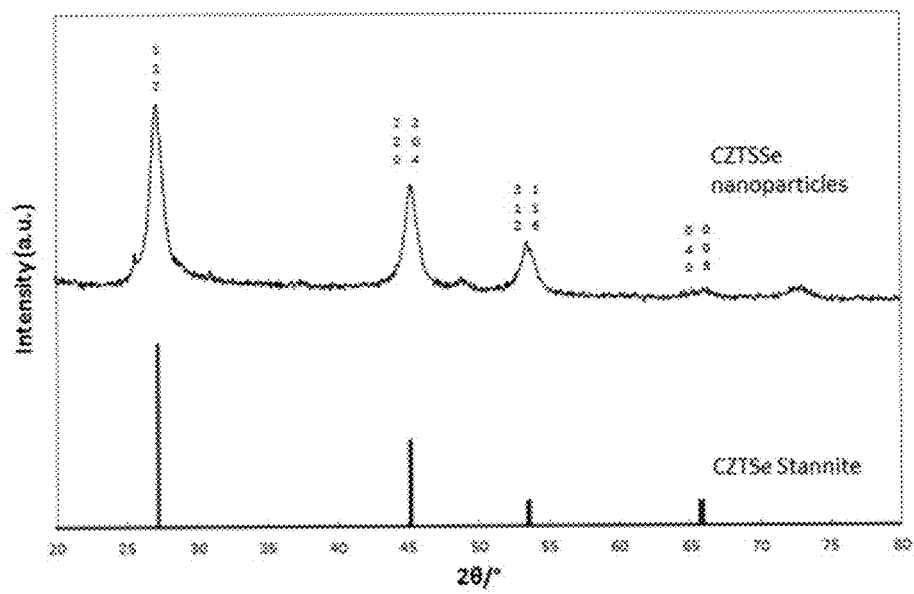
FIG. 9 is an XRD pattern of CZTSSe nanoparticles prepared according to Example 3.1. The peak positions are well matched to those of stannite CZTSe. [Olekseyuk et al., *J. Alloys Compd.*, 2002, 340, 141]

Elemental analysis of the inorganic components of the material by ICP-OES gave the following elemental ratios: Cu 15.99%; Zn 6.89%; Sn 19.24%; S 1.8%; Se 47.28%. Normalising to Sn, this gives a stoichiometry of $Cu_{1.55}Zn_{0.65}Sn_{1.00}S_{0.35}Se_{3.69}$, suggesting that the material is slightly Sn-rich. The organo-chalcogen ligands contribute to the total S and Se content. XRD analysis (FIG. 9) shows that the material closely matches the stannite crystal structure of CZTSe, [Olekseyuk et al., *J. Alloys Compd.*, 2002, 340, 141], supporting the relatively low proportion of S to Se as determined by ICP. A number of low intensity, unidentified peaks suggest the presence of a small proportion of an impurity phase. The stoichiometry can be tuned by altering the ratios of the metal precursors.

The inorganic content, as determined by TGA, was approximately 77% at 600° C. The TGA profile was similar to that of the 1-octane selenol-capped CZTSe nanoparticles in FIG. 4 with complete removal of the ligands below 350° C.; co-evaporation of the thiol and selenol ligands is facilitated by their relatively similar boiling points.

Example 4: Synthesis of CCdTSe Nanoparticles

Example 4.1

Synthesis of CCdTSe nanoparticles using 1-octane selenol as the selenium precursor. 1.00 g of Cu(ac) (8.2 mmol), 1.076 g of Cd(ac)$_2$.2H$_2$O (4.0 mmol) and 10 mL of 1-octadecene where degassed under vacuum for 1 hour in a 100 mL three-necked round-bottomed flask fitted with a magnetic stirrer and a condenser with a side-arm. The flask was purged with nitrogen. 480 μL, of SnCl$_4$ in 4 mL of dichloromethane (4.1 mmol) were added, then the mixture was stirred at room temperature for 1 hour. 12.0 mL of 1-octane selenol (67 mmol) were injected quickly into the flask. The temperature was raised to ~55° C. and held to allow the dichloromethane, which collected in the side-arm of the condenser, to distil off. The temperature was raised to 225° C. and held for 1 hour, before cooling to room temperature. The product, a black powder (2.72 g), was isolated with chloroform/acetone and dichloromethane/methanol. The solid was collected by centrifugation. The particles were dispersible in non-polar solvents.

Figure 10:
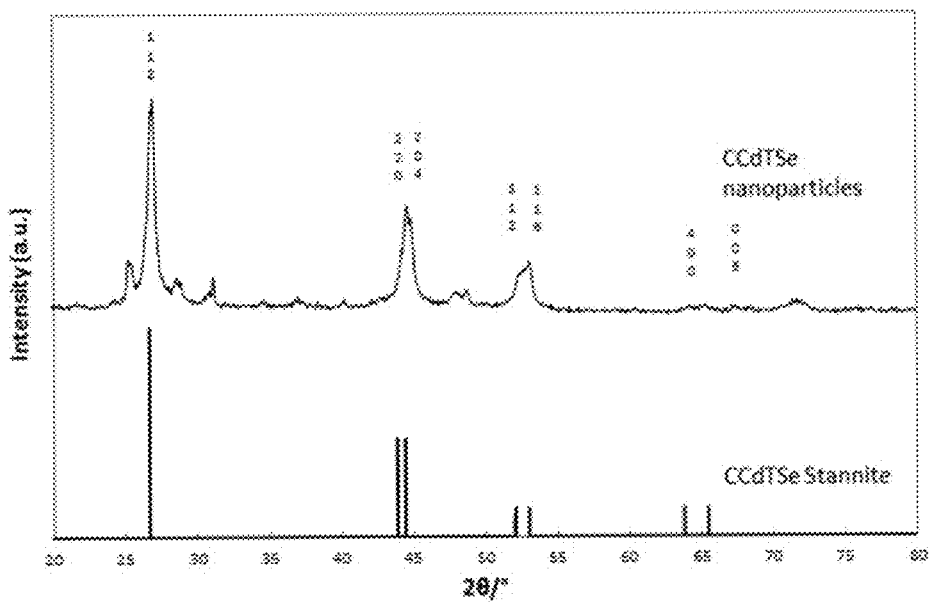
FIG. 10 is an XRD pattern of CCdTSe nanoparticles prepared according to method 4.1. The peak positions are well matched to those of stannite CCdTSe. [Olekseyuk et al., *J. Alloys Compd.*, 2002, 340, 141] Low intensity, unidentified peaks suggest the presence of a minor, secondary phase.

Elemental analysis of the inorganic components of the material by ICP-OES gave the following elemental ratios: Cu 15.47%; Cd 11.62%; Sn 17.78%; Se 42.16%. Normalising to Sn, this gives a stoichiometry of $Cu_{1.63}Cd_{0.69}Sn_{1.00}Se_{3.56}$, suggesting that the material is slightly Sn-rich. The inorganic content, as determined by TGA, was approximately 96% at 600° C., suggesting the particles are capped with relatively little ligand. XRD analysis (FIG. 10) shows that the major peaks closely match the stannite crystal structure of CCdTSe. [Olekseyuk et al., *J. Alloys Compd.*, 2002, 340, 141] Low intensity, unidentified peaks suggest the presence of a minor, secondary phase, possibly a binary, ternary or quaternary selenide phase. The stoichiometry can be tuned by altering the relative ratios of the precursors.

We claim:

1. A process for making $Cu_2XSnY_4$ nanoparticles, the process comprising:
   reacting in a solvent a copper precursor, an X precursor and a tin precursor in the presence of a primary chalcogen precursor comprising a labile organo-chalcogen to form a nanoparticle and to form a surface coating on the nanoparticle, the surface coating consisting of the labile organo-chalcogen
   wherein X is Zn, Cd, Hg, Ni, Co, Mn or Fe and Y is S and/or Se, and
   wherein the primary chalcogen precursor comprises Se when the X precursor comprises Zn.

2. A process as recited in claim 1, wherein the copper precursor is an acetate, an acetylacetonate or a chloride.

3. A process as recited in claim 1, wherein the X precursor is an acetate, an acetylacetonate, a chloride or a stearate.

4. A process as recited in claim 1, wherein the X precursor is zinc(II) acetate.

5. A process as recited in claim 1, wherein the X precursor is cadmium(II) acetate.

6. A process as recited in claim 1, wherein the X precursor is iron(II) acetylacetonate.

7. A process as recited in claim 1, wherein the X precursor is iron(III) acetylacetonate.

8. A process as recited in claim 1, wherein the tin precursor is a chloride.

9. A process as recited in claim 1, wherein the solvent is dichloromethane.

10. A process as recited in claim 1, wherein the tin precursor is tin(IV) acetate, tin(IV) bis(acetylacetonate) dichloride, or triphenyl(trimethyl) tin.

11. A process as recited in claim 1, wherein the solvent is a non-coordinating solvent.

12. A process as recited in claim 1, wherein the solvent is 1-octadecene or a heat transfer fluid.

13. A process as recited in claim 1, wherein reacting comprises mixing the copper precursor, X precursor, tin precursor and labile organo-chalcogen in a solvent at a first temperature not greater than 50° C. and then heating the solvent to a second temperature for a first time interval.

14. A process as recited in claim 13, wherein the first time interval is about 1 hour.

15. A process as recited in claim 1, wherein the second temperature is between 180° C. and 300° C.

16. A process as recited in claim 1, wherein the second temperature is between 220° C. and 240° C.

17. A process as recited in claim 1, wherein the labile organo-chalcogen comprises 1-octanethiol, 1-dodecanethiol, t-dodecanethiol, 2-naphthalenethiol, 1-octane selenol or 1-dodecane selenol.

18. A process as recited in claim 1, further comprising the addition of a secondary chalcogen precursor.

19. A process as recited in claim 18, wherein the secondary chalcogen precursor is trioctylphosphine sulphide or trioctylphosphine selenide.

20. A process as recited in claim 1, wherein reacting comprises mixing the copper precursor, X precursor, tin precursor and labile organo-chalcogen in a solvent at a first temperature not greater than 50° C. to form a mixture, heating the mixture to a second temperature to remove the solvent, and heating the remainder of the mixture to a third temperature.

* * * * *